United States Patent [19]

Berlinsky et al.

[11] Patent Number: 4,603,425
[45] Date of Patent: Jul. 29, 1986

[54] INTERPOLATION PULSE DURATION MODULATION CIRCUIT

[75] Inventors: Allan M. Berlinsky, Randolph, N.J.; Edward F. Regan, Middletown, R.I.

[73] Assignee: Raytheon Company, Lexington, Mass.

[21] Appl. No.: 646,343

[22] Filed: Aug. 31, 1984

[51] Int. Cl.⁴ .............................................. H03K 7/08
[52] U.S. Cl. .................................... 375/22; 332/9 R; 307/265
[58] Field of Search ............ 375/22; 370/9; 332/9 R; 329/106; 330/207 A; 307/265; 328/66, 111, 112, 151

[56] References Cited

U.S. PATENT DOCUMENTS

| | | | |
|---|---|---|---|
| 4,016,501 | 4/1977 | Jasinski et al. | 330/207 A |
| 4,099,109 | 7/1978 | Abbondanti | 307/265 |
| 4,502,024 | 2/1985 | Nishikawa et al. | 332/9 R |

Primary Examiner—Benedict V. Safourek
Attorney, Agent, or Firm—Martin M. Santa; Richard M. Sharkansky

[57] ABSTRACT

A pulse duration modulated (PDM) signal is generated from a periodic digitized signal which may be produced by sampling an analog signal of frequency $F_s$ and using a digitizing frequency F where $F >> F_s$. Linearity of the analog signal between sampling points is assumed. A computer solution of the intercept of the assumed straight line between each pair of successive sample values of the digitized signal and a reference triangular waveform of frequency F/2 provides the time interval between intercepts from which the interpolated pulse duration modulated (IPDM) waveform is generated. A method to add low frequency signals in the IPDM domain, useful for providing Class AD amplifiers with a feedback path and for summations of input signals without converting signals back to analog form, operates on the sum of the respective intercept times of each of the signals. The summed intercept times are used to provide an IPDM signal which represents the sum of the original digitized signals. Multiplication of digitized signals in the nonlinear (IPDM) domain is provided by operating on the product of the intercepts of two IPDM signals to obtain the intercepts of a new IPDM signal whose low frequency content is the product of the low frequency component of the two digitized signals. Interpolated signals thus are able to be modulated and frequency shifted in the IPDM domain to improve the linearity of IPDM for higher frequency signals (F not much greater than $F_s$).

15 Claims, 17 Drawing Figures

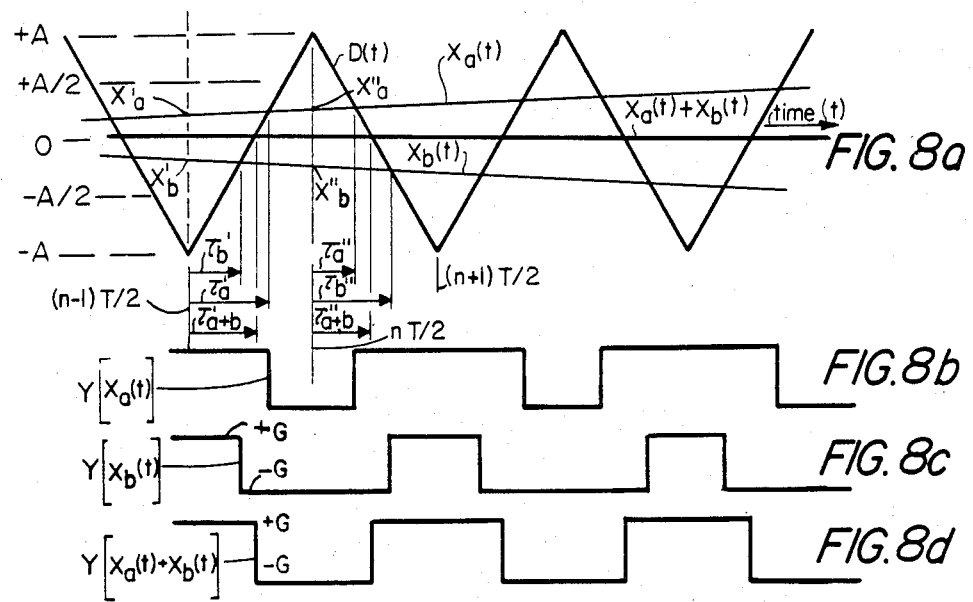
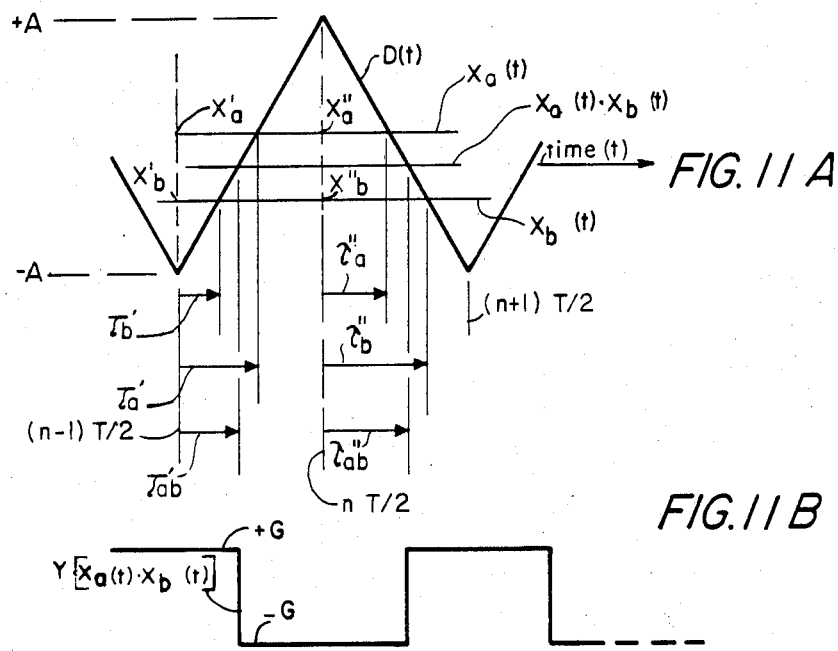

IPDM ADDER MODULATOR

INTERPOLATION PULSE DURATION MODULATION CIRCUIT

BACKGROUND OF THE INVENTION

This invention relates to pulse duration modulation and, more particularly, to a method and apparatus for providing a pulse duration modulation signal by using digital techniques useful for transmitters operating in a switched mode.

Pulse duration modulation (PDM) codes a relatively low frequency signal into a two-state waveform. Advantages exist in using this binary (two-state) time series. One consequence is that an amplifier that processes the coded waveform operates in a "switch" (Class D) mode instead of a "linear" mode (Class A or B). In other words, Class D amplifiers respond to PDM commands to turn solid state devices either "ON" or "OFF" in proper sequence. The output stage of the power transmitter, controlled in such a manner, amplifies the two-state waveform.

An important characteristic of the subsequent high power output signal is its low frequency content. If the PDM output is low-pass filtered, low frequency spectral components track linearly with the original low frequency input over a broad dynamic range. The input signal (the low frequency signal) is modulated by a high frequency carrier in the pulsewidths of the switch mode wave.

Several methods of generating a pulse duration modulated signal are available. A PDM waveform can be formed in both an analog or digital way. Digital processing is advantageous for several reasons. Firstly, if the input waveform is already in a digital format, digital-to-analog conversion is not required. Another important factor is that reliability increases by using a digital approach, since problems inherent to analog circuits do not exist in digital hardware. In the digital domain, however, other factors must be considered if a truly analogous approach to analog PDM is taken.

A prior art analog (continuous time) circuit 10 for generating a pulse duration modulated signal is shown in FIG. 1. $X(t)$ and $D(t)$ are both continuous waveforms. $X(t)$ is the low frequency input signal. $D(t)$ is a relatively high frequency triangle signal which will be referred to as a dither waveform. The amplitudes of the two signals are compared by a linear comparator 11 to provide $E(t)$ which, in turn, drives a two state device 12 such as a relay whose output terminal is alternately connected to voltage sources $+G$, $-G$ to provide an output signal $Y(t)$. If $X(t)$ is greater than $D(t)$, $Y(t)$ having a level $+G$ is generated at the relay's output. The opposite output level, $-G$, is produced if $X(t)$ is less than $D(t)$.

Analog circuitry has inherent problems that are difficult, if not impossible, to overcome. Components must be properly calibrated to compensate for hardware tolerances and drift. For these reasons, processing inaccuracies are induced due to physical device limitations. Circuit input must also be considered. A digital input to an analog PDM system requires D/A conversion of the signal prior to modulation to produce the binary output waveform. The additional hardware complexity in the D/A conversion process may reduce system reliability.

An analogous pulse duration modulator can be built in the digital domain. An approach to this circuit design is to compare, simultaneously, at a fixed rate, samples of a digital input signal $X(nt)$ with coincident samples of a digital triangular wave $D(nt)$. A very high input data rate is needed to compare $X(nt)$ and $D(nt)$ to obtain appropriate PDM waveform definition. As a consequence, high speed digital hardware is required to compare the two signals and to sufficiently define the PDM waveform. Hardware presently is not available to construct an analogous digital amplifier that will meet needed output requirements.

SUMMARY OF THE INVENTION

It is therefore an object of this invention to provide a pulse duration modulation transmitter which has an output which is stable, convenient to utilize with digital input signals, and whose output is a linear function of its input with distortion within specified requirements.

It is a feature of this invention that the pulse duration modulation is produced by interpolation of the sampled input signal to determine its crossover points with a reference (dither) signal from which crossover points the pulse duration is obtained.

The invention produces a time duration modulated signal from a sequence of digital input signals representing the sampled amplitudes of an analog signal sampled at a frequency F. The sampling frequency F is many times larger than the highest frequency of the analog signal so that the signal is assumed linear between each pair of sampled values. The interpolated intercepts of the linear signal with a triangular waveform of frequency $F/2$ whose apices are time coincident with the signal samples provide the times at which the output waveform changes state to thereby produce the interpolated pulse duration modulated (IPDM) signal in which the input signal is encoded.

A computer solution of the intercept of the assumed straight line between each pair of successive sample values of the digitized signal and a reference triangular waveform of frequency $F/2$ provides the time interval between intercepts from which the interpolated pulse duration modulated (IPDM) waveform is generated. A method to add low frequency signals in the IPDM domain, useful for providing Class AD amplifiers with a feedback path and for summations of input signals without converting signals back to analog form, operates on the sum of the respective intercept times of each of the signals. The summed intercept times are used to provide an IPDM signal which represents the sum of the original digitized signals. Multiplication of digitized signals in the nonlinear (IPDM) domain is provided by operating on the product of the intercepts of two IPDM signals to obtain the intercepts of a new IPDM signal whose low frequency content is the product of the low frequency component of the two digitized signals. Interpolated signals thus are able to be modulated and frequency shifted in the IPDM domain to improve the linearity of IPDM for higher frequency signals (F not much greater than $F_s$).

It is a further object of the invention to provide a method for adding IPDM signals, useful for providing Class AD amplifiers with a feedback path and for summations of input signals without converting signals back to analog form, by summing the intercept times of each of the IPDM signals. The summed intercept times are used to provide a IPDM signal which represents the summed signals.

It is still a further object of the invention to provide a multiplication of signals in the nonlinear (PDM) domain by the multiplication of the intercepts of two IPDM signals to obtain the intercepts of a new IPDM signal whose low frequency content is the product of the low frequency component of the two signals. Interpolated signals by this procedure are able to be modulated and frequency shifted to improve the linearity of IPDM for higher frequency signals.

BRIEF DESCRIPTION OF THE DRAWINGS

The aforementioned aspects and other features of the invention are explained in the following description taken in conjunction with the accompanying drawings wherein:

FIGS. 8a, 8b, 8c and 8d are waveforms illustrating the addition of interpolated pulse width modulation signals;

FIGS. 11A and 11B are waveforms illustrating multiplication of interpolated pulse duration signals.

DESCRIPTION OF THE PREFERRED EMBODIMENT INTERPOLATION PULSE DURATION MODULATION (IPDM)

Figure 1:
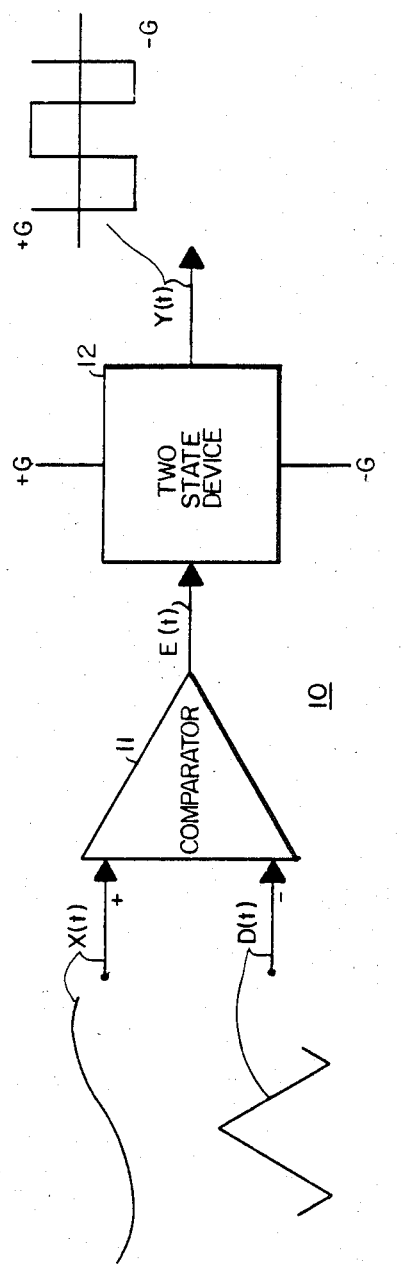
FIG. 1 is a block diagram of a prior-art pulse duration modulation circuit.
Figure 2:
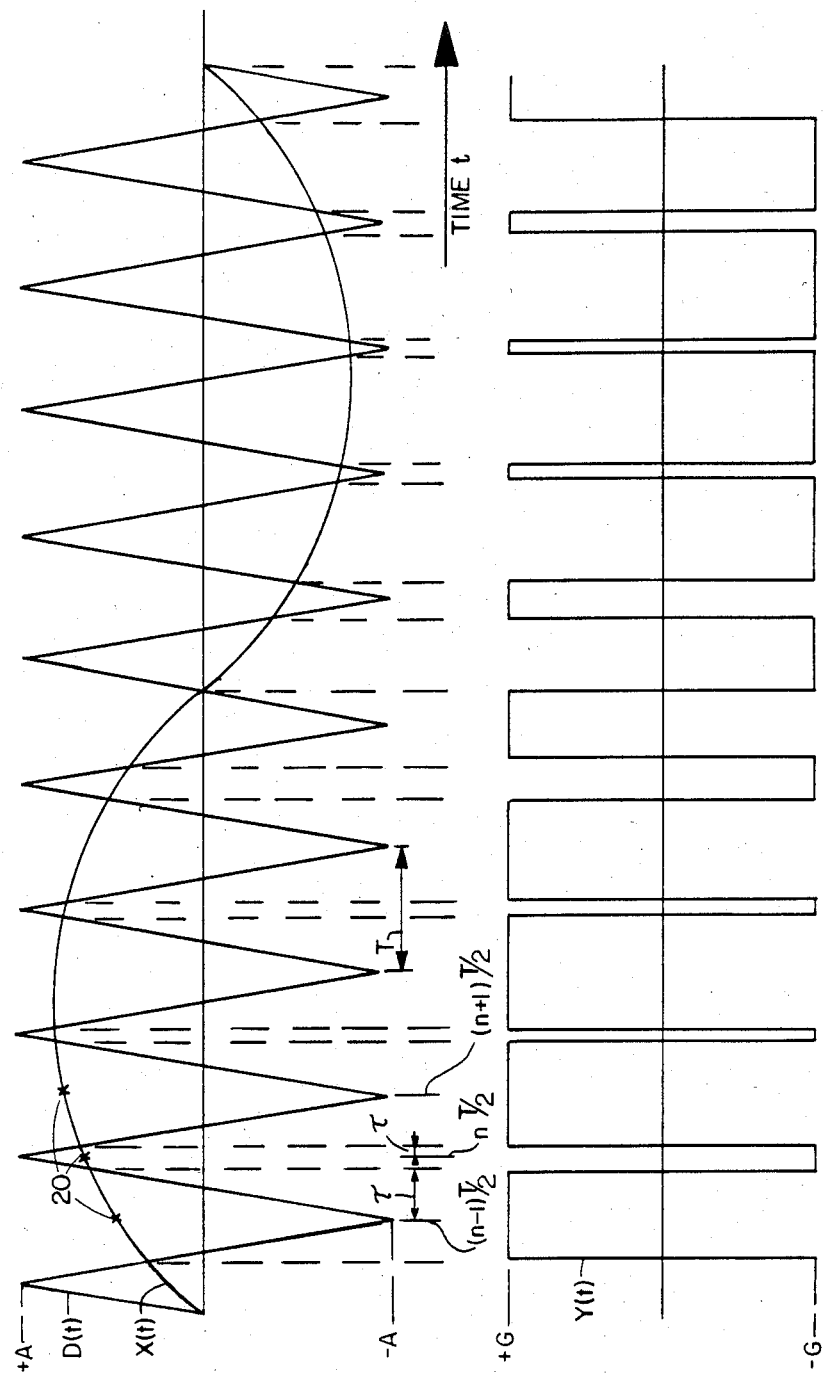
FIG. 2 shows waveforms illustrating conceptually the sampling of a signal and its intersection with a dither signal to produce a pulse duration modulated signal.

This invention provides a considerably more effective digital approach to PDM generation. This method utilizes characteristics of the input signals (the triangular and sinusoidal waveforms) and the output two state waveform (the PDM waveform). A characteristic property of the inputs to the modulator (the low frequency input signal X(t) and the high frequency dither signal D(t)) is that the triangle dither waveform is at a frequency much greater than the input sinusoid ($F >> F_s$). In FIG. 2, the system inputs X(t), D(t) and the PDM output Y(t) are shown, Y(t) being assigned the value $+G$ for time instances at which X(t)>D(t) and the value $-G$ when X(t)<D(t).

From FIG. 2 it is seen that to generate the PDM signal Y(t) only knowledge of the instances at which the input sinusoid X(t) crosses the dither signal D(t) and the slope of the dither signal at the crossover times are needed to define the two state waveform Y(t). The crossover points define the switch times of the two state waveform. Added information related to one slope of the dither signal is used to define the actual state at the two state switch (whether $+G$ or $-G$). A change in output state is thus defined from the crossover time and the dither signal slope. Particularly, at a crossover time, if the slope of D(t) is negative, state Y(t) is positive until the next switch point. On the other hand, Y(t) is negative until the next switch point if the slope of D(t) is positive at the crossover time. Information at times other than at the crossovers is superfluous because the output state of Y(t) remains constant between crossovers. Consequently, if the switch points and respective dither signal slopes are known, no further information is required to define the two state output waveform Y(t).

Reference to FIG. 2 illustrates that the triangular dither signal D(t) is linear, with constant slope over one-half the dither period. The dither signal is still linear over the second half of the dither period; however, the sign of its slope has reversed. The sinusoidal input signal X(t), also, since its frequency is considerably less than that of the triangle waveform, can be considered to be piecewise linear between adjacent sampled values 20. These sampled values of the input signal occur at the time the waveform D(t) is at its peak extremities which happens every one-half dither period (T/2).

The dither signal is defined in a piecewise sense within ½ a dither period by the equation:

$$D(t) = m't + b' \qquad (1)$$

where $m' = \pm 4A/T$ and $b' = \mp A$;

A = the magnitude of the peak dither signal amplitude which alternates sign every T/2 sec; and T = the period of the dither signal.

The input signal is piecewise defined within ½ the dither period as:

$$X(t) = mt + b \qquad (2)$$

where $m = [2/T][X(nT/2) - X((n-1)T/2)]$ and $b = X[(n-1)T/2]$ where n is the dither signal ½ period number (n = 0, ... k).

The output waveform Y(t) changes state when:

$$X(t) = D(t). \qquad (3)$$

The output state change within ½ a dither period (T) is defined as:

Y(t) = +G when sgn [m'] = −1 for (n−1)T/2 < t ≤ nT/2;

Y(t) = −G when sgn [m'] = +1 for (n−1)T/2 < t ≤ nT/2.

The intercept time, $\tau$, referenced to the sample instant at the beginning of each half period (T/2) of the dither signal D(t), is easily computed by solving the intercept equation, Equation 3, for the variable, $\tau$ (where $\tau$ is measured from the apex of the dither signal). In particular, $$\tau = (b' - b)/(m - m'). \qquad (4)$$

The process to determine the intercept time is repeated for all intervals spaced T/2 apart. Samples of the input and dither signals are needed to solve for $\tau$; but only those successive samples spaced T/2 seconds apart are used for each successive computation of $\tau$. In contrast to the prior art digital PDM processing method discussed earlier, this approach greatly reduces the input sampling rate. An additional feature of interpolation PDM method is that the dither signal D(t) is not physically generated. Pairs of constants ([−b', +m'], [+b', −m']) which alternate at a T/2 rate, define the triangular waveform and are inserted in the intercept time equation (4). As a result, a pseudo-dither signal is constructed using the appropriate pair of constants. The additional variables b and m are derived from successive samples of the input signal spaced T/2 sec. apart.

Figure 3:
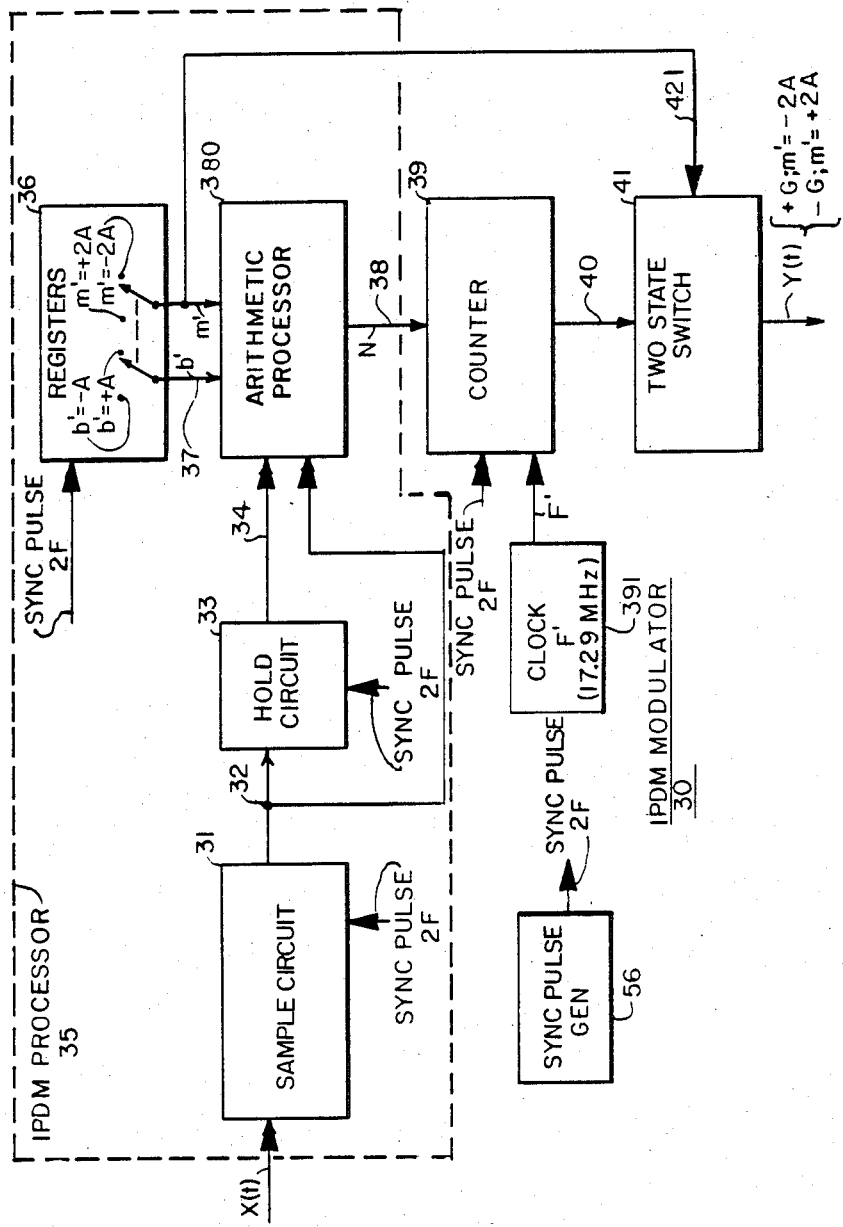
FIG. 3 is a block diagram of a circuit providing an interpolated pulse duration modulated signal by computation of intercept time of signal and dither signals.

The interpolation process just described is implemented by the IPDM modulator 30 shown in the diagram of FIG. 3. The IPDM output signal Y(t) is generated by sampling a low frequency input signal X(t) every T/2 sec. in sample circuit 31. The sampled signal 32 is held for T/2 sec. in hold circuit 33 at which time it is available as a signal at the output 34. The delayed signal at output 34 and the undelayed sampled signal at terminal 32 are provided to arithmetic processor 380 which computes the slope m (for equation 4) from these values of X(t). The value of the delayed signal at output 34 is the value b for Equation (4). The arithmetic processor 380 has another input from registers 36 which alternates at the rate T/2 and provides the input pairs [m' = +2A, b' = −A] and [m' = −2A, b' = +A], respectively, at its outputs 37 and 42. The inputs to arithmetic processor 380 are used in the computation of the intercept time $\tau$ (equation 4). A count, N, at the rate F' of the time $\tau$ is provided every T/2 seconds at output 38 of IPDM processor 35. The count N of the computed values of $\tau$ are provided to a counter 39 that operates at a frequency F' providing a pulse at its output 400 $\tau+\epsilon$ sec. after the sync pulse (frequency 2F). The sync pulse occurs every T/2 sec. $\epsilon$ is a time error due to finite pulse time resolution. The output 400 pulse actuates a two-state switch 41 which has another input 421 which carries the sign information of the slope m' to define the polarity of the output Y(t). If m' is positive, the output Y(t) of switch 41 is −G, whereas if m' is negative, Y(t) is +G. Switch 41 includes a Class AD amplifier (not shown) which provides the gain factor G for amplification.

A time delay of T/2 seconds exists between the intercept time of input X(t) and the time of change of state of output Y(t) if the time to compute the intercept is assumed to be negligible. A maximum time delay of T/2 is permitted to generate the IPDM signal in real time with the storing of only one input sample. An additional group delay (phase shift) is added if computation time is considered.

The components of modulator 30 are easily implemented by digital hardware. The most difficult operation in the overall process is the computation of the intercept time in real time. The maximum time allowed to calculate the intercept is limited to T/2 sec. Different algorithmic approximations of the switch time are possible that allow the computation to be made in the time available with standard digital devices.

A procedure to approximate the intercept time is to substitute a power series, or Maclaurin series, expansion for the exact analytical expression of Equation 4. The solution to the time of intercept, $\tau$, may be approximated by a two-term Maclaurin expansion, given by f(x)=f(0)+(x)(f'(0)), where, f'(0)=the first derivative of the exact intercept expression. A one-term Maclaurin expansion is simpler and is of the form f(x)=f(0). Both one-term and two-term expansions are implemented to validate the performance of the IPDM Class AD amplifier. The power series approximations reduce a time-consuming division of Equation (4) to a set of multiplications. Even though series approximations to the IPDM intercept time are made, sufficient accuracy is maintained in describing the intercept time.

Another consideration that affects amplifier performance is word length. The accuracy of mathematical operations is a function of the number of bits required to sufficiently represent the data. Computational errors, together with inaccuracies dependent upon how well the input samples and output switch times are defined must be considered to appropriately predict performance and to physically validate system operation.

A list of system performance and hardware constraints are summarized in Table 1. These specifications are incorporated in the design of an IPDM modulator. Two modulator configurations are considered. One of them, IPDM modulator 40 shown in FIG. 4, embodies the processes depicted in FIG. 3 but utilizes a one-term Maclaurin expansion in the IPDM processor 35'. The other modulator 50 of FIG. 5 uses a two-term approximation. The one-term expansion amplifier 40 is based on computing the intercept time by the following Maclaurin approximation to the true intercept time.

$$\tau_{one\text{-}term} = [T/2] \, [(X(n-1)T/2) \pm A)/\pm 2A] \qquad (5)$$

Figure 4:
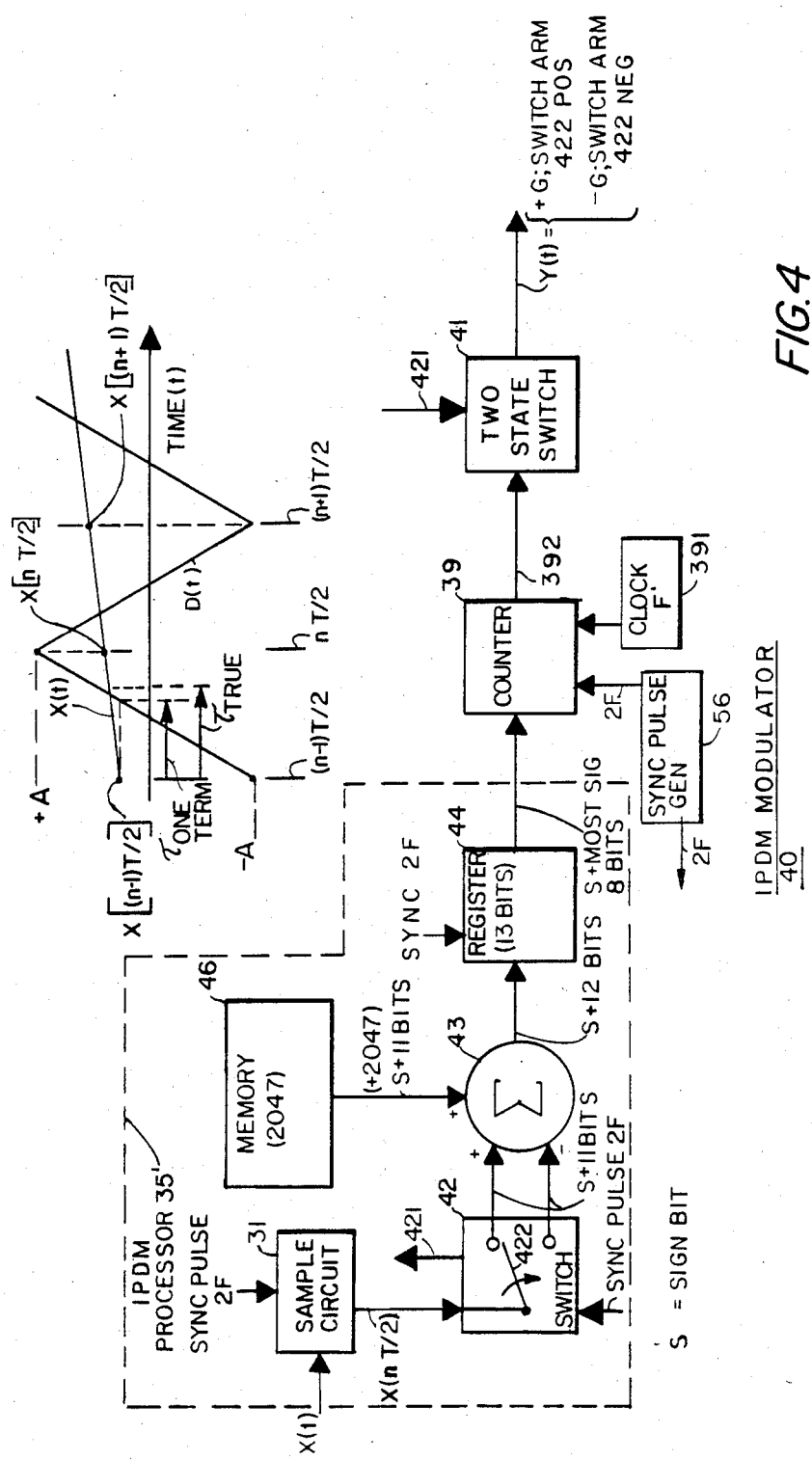
FIG. 4 is a block diagram of a circuit using a one-term Maclaurin expansion approximation of the intercept time of signal and dither signals.

Reference to the waveforms X(t), D(t) on FIG. 4 and Equation 5 shows that the true intercept time $\tau_{true}$ of X(t) with D(t) differs slightly from the approximate intercept time, $\tau_{one\text{-}term}$, obtained from Equation 5. It is observed that the time intercept $\tau_{one\text{-}term}$ of the one-term Maclaurin approximation is obtained from the intercept of D(t) with X(t) at the time (n−1)T/2. X(t) is considered to have zero slope (to be constant) over the complete T/2 interval.

$$\tau_{two\text{-}term} = [T/2][X(n-1)T/2) \pm A] \\ [[(1/(\pm 2A)] - [(X(nT/2) - X((n-1)T/2))/(2A)]]. \qquad (6)$$

Figure 5:
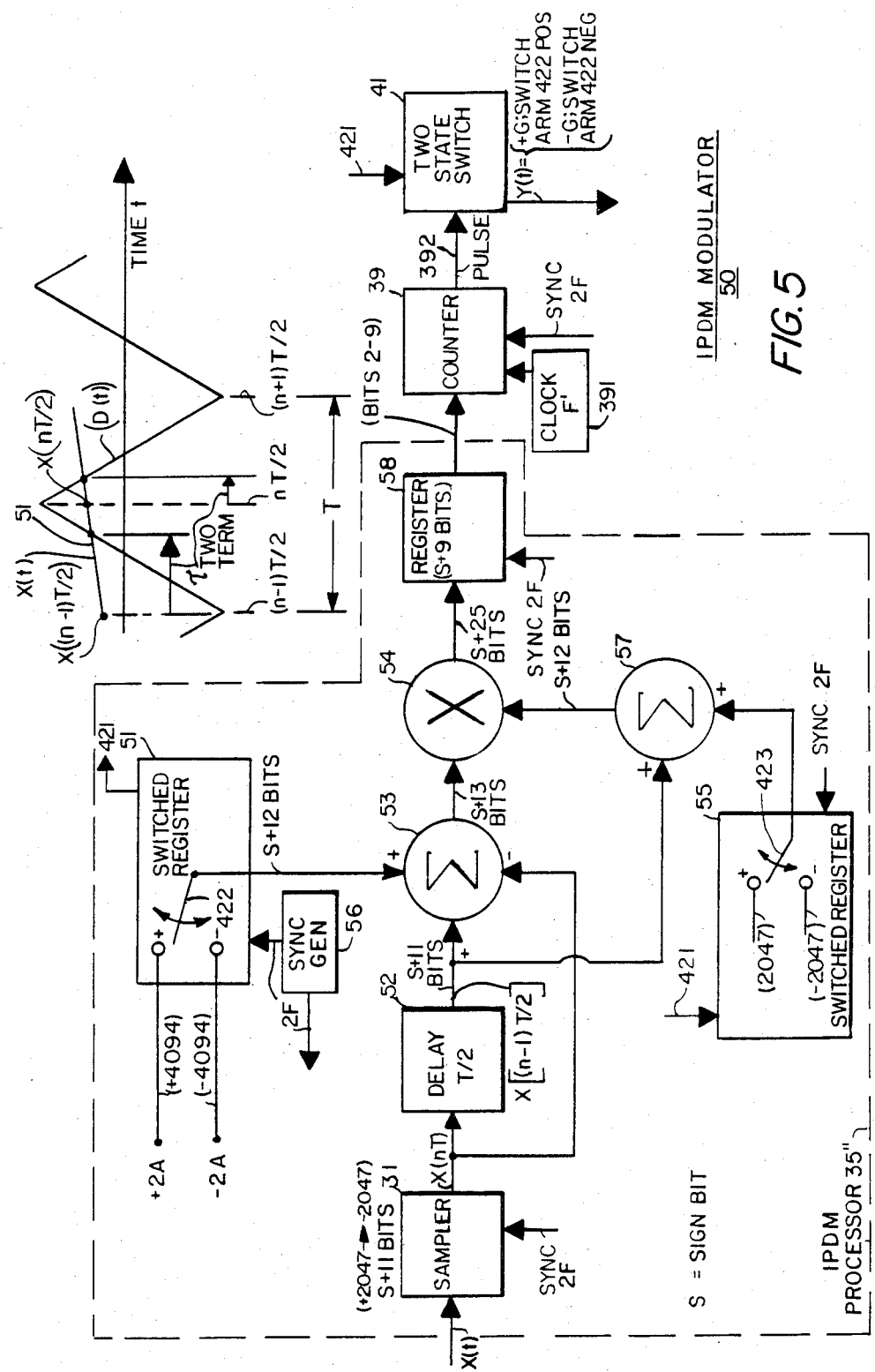
FIG. 5 is a block diagram of a circuit using a two-term Maclaurin expansion approximation of the intercept time of signal and dither signals.

Reference to waveforms X(t), D(t) of FIG. 5 and Eq. (6) show that the time intercept $\tau_{two\text{-}term}$ is obtained by estimating with a two-term expansion the intersection of the waveform D(t) with straight line 51, having a value X[(n−1)T/2] at time [(n−1)T/2] and having a slope [X(nT/2)−X[(n−1)T/2]]/(T/2).

TABLE 1

| IPDM AMPLIFIER SYSTEM PARAMETERS | |
| --- | --- |
| Output Clock Frequency (F') | 17.92 mHz |
| Output Clock Period (T') | 5.58 $10^{-8}$ sec. |
| Input Signal Frequency (F$_S$) | 2 kHz to 4 kHz |
| Dither Signal Frequency (F) | 35 kHz |
| Dither Period (T) | 2.86 $10^{-5}$ sec. |
| Input Word Length | 11 Bits + Sign |
| Dither Signal Peak Amplitude (A) | 1 volt |

The input word length of the sampled signal X(nT/2) is limited in the designs of FIGS. 4 and 5 to 12 bits (11 bits + 1 sign bit). Fixed point arithmetic is also assumed. From the sampled input and the pseudo dither signal (D(t) sample value of +1, −1 at intervals of T/2), the number of clock counts necessary to generate the appropriate switch times (relative to a clock sync pulse each T/2 sec.) is computed. Each clock count represents discrete time units of T' seconds. With the specifications listed in Table 1, the clock count N, which the IPDM processor 35 and counter 39 must have the capacity for handling, for a one-term expansion is:

$$N_{one\ term} = [2^{-4}] \cdot [X((n-1)T/2) \pm 2047].$$

A two-term configuration necessitates additional processing complexity. For this case, the clock count N which must be handled by processor 35 and counter 39 is determined by computing:

$$N_{two\ term} = [2^{-16}] \cdot [\pm 4094 - (X(nT/2) - X((n-1)T/2))] \cdot [\pm 2047 + X((n-1)T/2)].$$

The IPDM processor 35' of amplifier 40 of FIG. 4, which implements Eq. 5, has a memory 46 which stores the peak value A of the dither signal D(t) as an eleven bit binary number (2047 decimal) and a sign bit. The maximum binary representation of the input signal X(t) is limited to the same number of bits. The input signal X(t) is sampled in sample and hold circuit 31 by the sync pulse 2F of generator 56 to provide the sample values X(nT/2). The sampled input signal X(nT/2) has its sign effectively alternated every T/2 seconds by the sync pulse 2F from the sync pulse generator 56 applied to switch 42 whose arm 422 makes alternate connections to the + and − inputs of summing circuit 43. The output of switch 42 and memory 46 are summed in digital summing circuit 43 which provides a sign plus twelve bit output. The sign plus the eight most significant bits of the output of summing circuit 43 are extracted from the 13 bit-input register 44. The output of register 44 is gated into counter 39 every T/2 seconds by the sync pulse 2F of generator 56. The counter is reinitialized each time it is gated. Counter 39 is clocked by clock pulse source 391 at frequency F' = 17.92 mHz and provides a trigger pulse at its output line 392 when the count provided by register 44 is reached. The trigger pulse 392 switches the output state of Y(t) of the two-state switch 41. In order to preserve the phase of X(t) in the PDM signal Y(t), the signal on line 421 indicating the position of switch arm 422 of switch 42 is provided to two-state switch 41 so that the output state of Y(t) is +G when the arm 422 is connected to the positive input of the summer 43 and Y(t) is −G when arm 422 is connected to the negative input of the summer 43.

The signal processing for the two-term expansion approximation of X(t) is provided by the IPDM processor 35'' of amplifier 50 of FIG. 5 which implements Equation (6). The input signal X(t), which is a digital signal whose binary representation cannot exceed eleven bits plus a sign bit ($-2047 < X(t) < +2047$), is sampled by sampler 31 at the sync rate 2F (T/2 seconds) provided by sync circuit 56. The output of sampler 31, (X(nT)), is provided to a delay circuit 52 of delay T/2 seconds and also to a subtract input of summer 53. The output X[(n−1)T/2] of delay 52 at time nT/2 is provided to a positive input of summer 53. A twelve bit binary number and sign bit (+4094 or −4094) is alternately provided by a switched register 51, which is switched at the sync rate 2F, to a positive input of summer 53. The output of summer 53 is provided as a 13 bit binary number and a sign bit to multiplier 54. The output of summer 53 implements the third bracketed term [ ] of Equation (6).

A register 55 whose output is switched at the sync rate 2F (T/2 sec.) provides an eleven bit binary number and a sign bit (+2047 or −2047 in accordance with the positive or negative polarity, respectively, of the signal on line 421) to a summer 57. The other input to the summer 57 is the delayed signal X[(n−1)T/2] provided at the output of delay 52. The output of summer 57 implements the second bracketed [ ] term of Equation (6) and is defined by a twelve bit number and a sign bit.

The outputs of summers 53, 57 are provided as inputs to multiplier 54 whose output is defined by a twenty-five bit number and a sign bit which is provided to a register 58 where only the second through ninth most significant bits (a binary number representing a maximum decimal equivalent of 256) of the multiplier 54 output are retained. The sync pulse circuit 56 gates the output of register 55 into counter 39 at a 2F rate. The counter is reinitialized for each sync pulse. Counter 39 is clocked at the frequency F' (17.92 MHz) and provides an output pulse on line 392 when the count is reached. The count will be reached within the time T/2 so that the counter 39 is ready to receive a new number at the 2F rate from register 58 at the next sync pulse. The pulse on line 392 causes the output state Y(t) of the two-state switch 41 to change to the opposite state. In order to preserve the phase of X(t) in the PDM signal Y(t), the sign information at switched register 51 is provided by the signal on line 421 to switch 41 (also to switched register 55) so that the output state of Y(t) is +G when the arm 422 of register 51 is connected to positive 2A and Y(t) is −G when the arm 422 is connected to negative 2A.

In both FIGS. 4 and 5, bits in excess of those needed by the counter 39 are discarded. The second through ninth bits of multiplier 54 of FIG. 5 are used to compensate for a scale change made in the implementation of equation 6 by amplifier 50. It should also be noted that the maximum value of X(t) is not allowed to exceed the value of A. The output Y(t) of the amplifier 50, when lowpass filtered, (i.e., applying Y(t) to a filter that allows passage of the highest frequency $F_s$ in input signal X(t)) retains the amplitude tracking and phase characteristics of the original input sinusoid. The peak amplitude of this filtered signal is scaled by the factor G.

Figure 6:
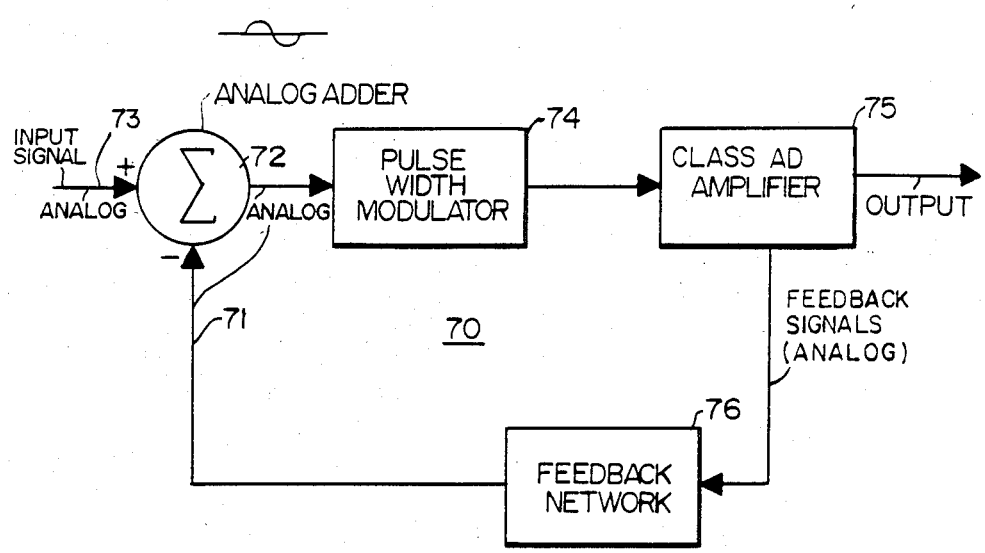
FIG. 6 is a block diagram of a negative feedback amplifier of the prior art for a pulse duration modulated signal.

IPDM WAVEFORM ADDITION:

The prior art Class AD amplifier design 70 shown in block diagram form in FIG. 6, utilizes an analog feedback control method to meet system performance criteria. Analog control signals 71 monitoring the pulse width modulator 74 and amplifier 75 functions are linearly summed (negative feedback) in an analog manner in adder 72 to the low frequency analog input signal 73. The resulting analog waveform is pulse duration modulated (PDM) in a conventional modulator 74 and amplified by the Class AD amplifier 75 to provide a digital PDM output 77. The circuit 70 of FIG. 6 requires the use of an analog feedback control network 76 for compensation.

IPDM digital feedback, on the other hand, is feasible if the input 81 and the feedback signal 89 are combined after they are individually processed by IPDM processors 35. To achieve linear feedback output quantities on lines 85, 82, respectively, as shown in the circuit 80 of FIG. 7, must be summed in the IPDM domain by IPDM adder 86. The summing of IPDM signals 82, 85 in IPDM adder 86 should effectively perform linear addition in the IPDM domain before signal 88 is applied as an input signal to amplifier 87. The IPDM addition process allows the combination of two-state signals in the nonlinear IPDM domain instead of in the linear time domain to obtain a new IPDM signal with the desired linear waveform characteristics. The low frequency content of the resulting IPDM signal on line 88 contains the linear sum of the low frequency components contained in the original IPDM inputs 82, 85. Negative feedback is accomplished by a 180° phase shift of filtered feedback signal 89 represented by the negative sign 841 at the input of its processor 35. The Class AD amplifier 87 is explicitly shown even though it is implicitly a part of two-state switch 41 having a gain G in IPDM adder 86 both shown in FIG. 9.

The process of combining two PDM waveforms and retrieving the linear sum of their respective low frequency components evolves from the low frequency analysis of a single two-state waveform.

Principles extracted from the IPDM procedure of IPDM modulation are applied in the summing technique. FIG. 8(a) shows the signals $X_a(t)$, $X_b(t)$ and $D(t)$. The frequencies of $X_a(t)$, $X_b(t)$, the input signals to be added, are significantly lower than that of $D(t)$, the triangle dither signal. For simplicity, since $X_a(t)$, $X_b(t)$ are slowly-varying compared to $D(t)$, they are shown as straight lines over the period of $D(t)$. The IPDM signal for each signal $X_a(t)$, $X_b(t)$ is constructed by computing the times at which each of the signals $X_a(t)$, $X_b(t)$ intercept $D(t)$. The individual IPDM signals are shown as signal $Y[X_a(t)]$ and $Y[X_b(t)]$ in FIGS. 8b and 8c, respectively.

As seen earlier in the description of IPDM modulation, the intercept equations depend on the slope of the triangle signal $D(t)$ during each ½ dither period. If the slope of the triangle is positive, using a simple geometric relationship, and assuming $X(t)$ to be linear over a dither time period, the time $\tau'$ of the intercept point with the dither signal $D(t)$ is $$\tau'=(T/4)(1+X(t)/A) \text{ in the region that the slope of } D(t) \text{ is positive.} \qquad (7)$$

If two input signals $X_a(t)$ and $X_b(t)$ are individually modulated (see FIGS. 8(b) and (c)) the positive slope switch points for the respective signals are $$\tau_a'=(T/4)(1+X_a(t)/A) \text{ (in the region that the slope of } D(t) \text{ is positive)} \qquad (8)$$

and $$\tau_b'=(T/4)(1+X_b(t)/A) \text{ (in the region that the slope of } D(t) \text{ is positive).} \qquad (9)$$

The switch point of an IPDM waveform (FIG. 8(d)) that results from the linear sum of $X_a(t)$ and $X_b(t)$ is, similarly, (see FIG. 8(a))

$$\tau_{a+b}'=(T/4)(1+[X_a(t')+X_b(t')]/A) \text{ in the region that the slope of } D(t) \text{ is positive.} \qquad (10)$$

$X_a(t)$ and $X_b(t)$ are two signals that drive two separate modulators in parallel to provide the IPDM waveform of FIGS. 8(b) and 8(c), respectively. The time intercepts $\tau_a'$ and $\tau_b'$ are, therefore, definable quantities. They are obtained from individual modulator outputs. From this information, a time intercept $(\tau_{a+b}')$ equivalent to that of the linear sum of $X_a(t)$ and $X_b(t)$ is obtained. To reach this end, consider the following relationship between the quantities $\tau_{a+b}'$, $\tau_a'$, and $\tau_b'$: $\tau_{a+b}'=\tau_a'+k\tau_b'$ (in the region that the slope of $D(t)$ is positive) $\qquad (11)$ By making use of the preceding four equations, the following equation for k is obtained $$k=(\tau_b'-(T/4))/\tau_b' \qquad (12)$$

Thus, substituting equation 12 into 11

$$\tau_{a+b}'=\tau_a'+\tau_b'-(T/4) \text{ (in the region that the slope of } D(t) \text{ is positive)} \qquad (13)$$

The triangle waveform (the dither signal) changes from a positive slope to negative slope each T/2 sec. Over a negative slope region, the intercept equation is derived in a manner similar to that discussed for the positive slope. The switch point for a single input $X(t)$ is $$\tau''=(T/4)(1-(X(t)/A)) \text{ (in the region that the slope of } D(t) \text{ is negative).} \qquad (14)$$

Although the time of intercept equation differs, the final addition relationship remains the same as for the positive slope intercept case. That is, $$\tau_{a+b}''=\tau_a''+\tau_b''-(T/4) \text{ (in the region that the slope of } D(t) \text{ is negative).} \qquad (15)$$

The generalized IPDM addition equation is $$\tau_{a+b}=\tau_a+\tau_b-T/4 \text{ (in the region that } D(t) \text{ is either positive or negative)} \qquad (16A)$$

In IPDM clock counts equation 16A is rewritten as $$N_{a+b}=N_a+N_b-T_N/4 \qquad (16B)$$

Where $T_N$ is the maximum number of clock counts in the period of the triangular signal.

Figure 9:
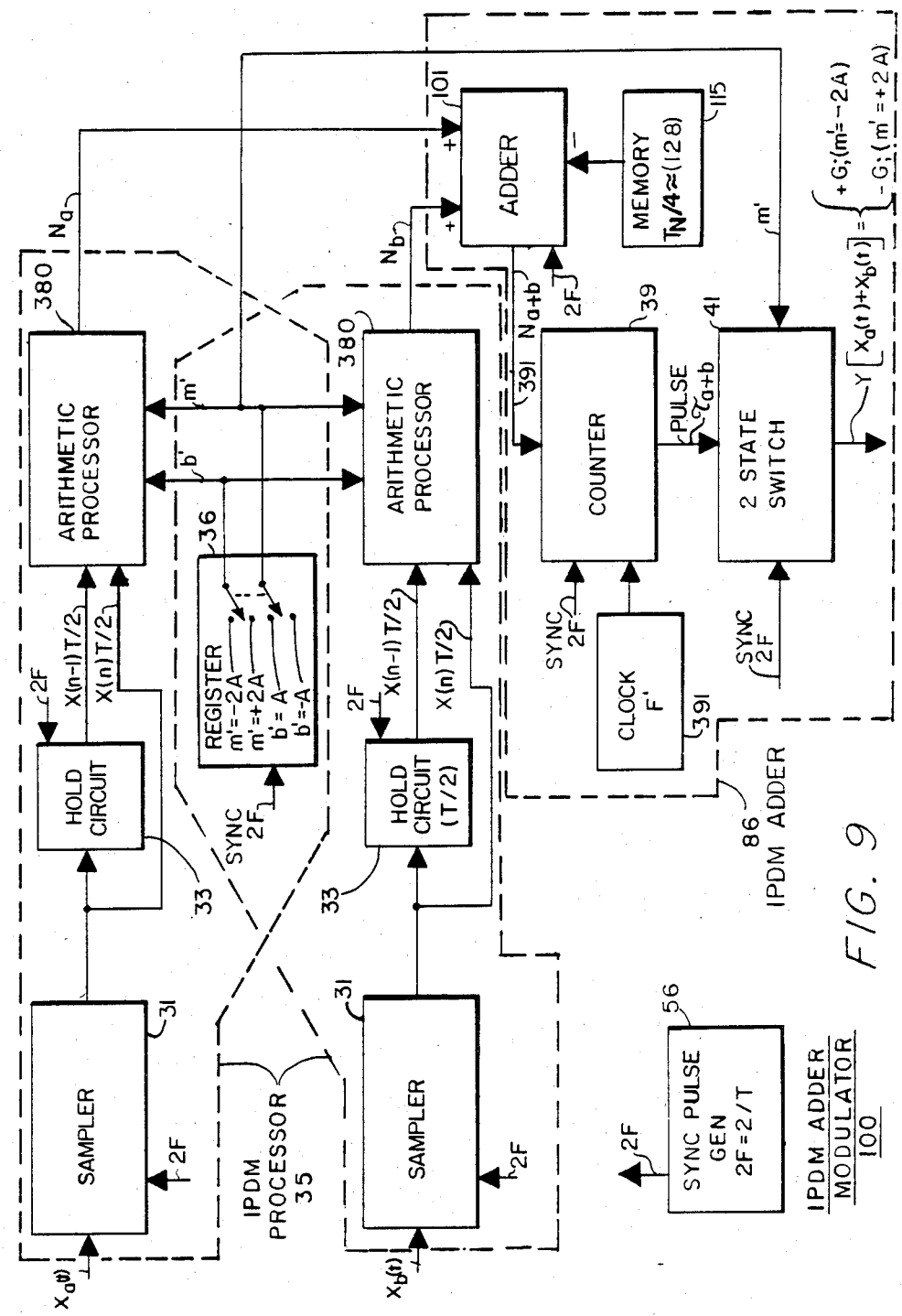
FIG. 9 is a block diagram of a circuit for adding interpolated pulse duration signals.

Referring now to FIG. 9, a block diagram of an IPDM adder modulator 100, both $N_a$ and $N_b$ are available as numerical quantities from individual IPDM processors 35 operating on the signals $X_a(t)$ and $X_b(t)$, respectively. The physical two-state waveforms of FIGS. 8(b) and 8(c) themselves are not needed to generate the new two-state waveform of their linear sum shown in FIG. 8(d). $N_a$ and $N_b$ are the outputs, respectively, of respective IPDM processors 35. The outputs, $N_a$ and $N_b$, are obtained during a T/2 interval of $D(t)$ and equation 16B is then computed by IPDM adder 86. The numerical values of $N_a$, $N_b$ and $T_N/4$ are summed in adder 101 to provide $(N_a+N_b-T_N/4)$ on line 391 to counter 39 which generates a pulse when the count provided by adder 101 at a rate F' is reached. The counter 39 clock frequency, F', (17.92 MHz) is such that a maximum count is reached in time $\leq T/2$. The output pulse of counter 39 produced when the count provided on line 391 is reached changes the output state of switch 41 where the output of the switch $Y(t)=+G$ or $-G$ depending upon the sign of m', (minus or plus, respectively) that is provided by register 36 for the reason given in the description of the circuit of FIG. 3.

Thus, a time intercept $\tau_{a+b}$ defines the switch point instead of $\tau_a$ or $\tau_b$ separately. $\tau_{a+b}$ cannot exceed T/2, nor can it be negative. If such a condition exists, the switch time is not defined. The fact that the $\tau_{a+b}$ exceeds T/2 or is negative yields a count $N_{a+b}$ that is greater than $T_N/2$ or negative. These occurrences warn that the summed signal "overmodulates" (overdrives) the processor.

Figure 10:
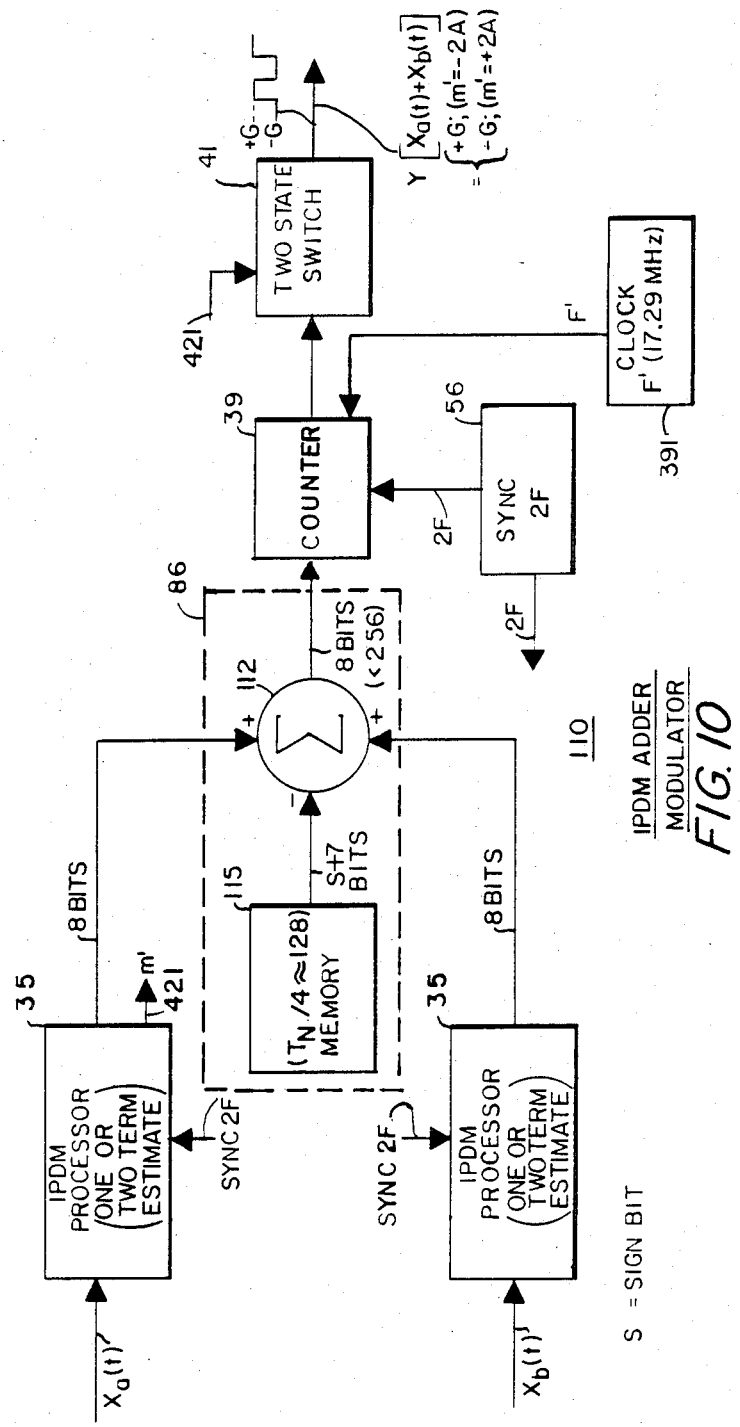
FIG. 10 is a block diagram of a circuit for adding one- or two-term approximation interpolated pulse duration signals.
Figure 12:
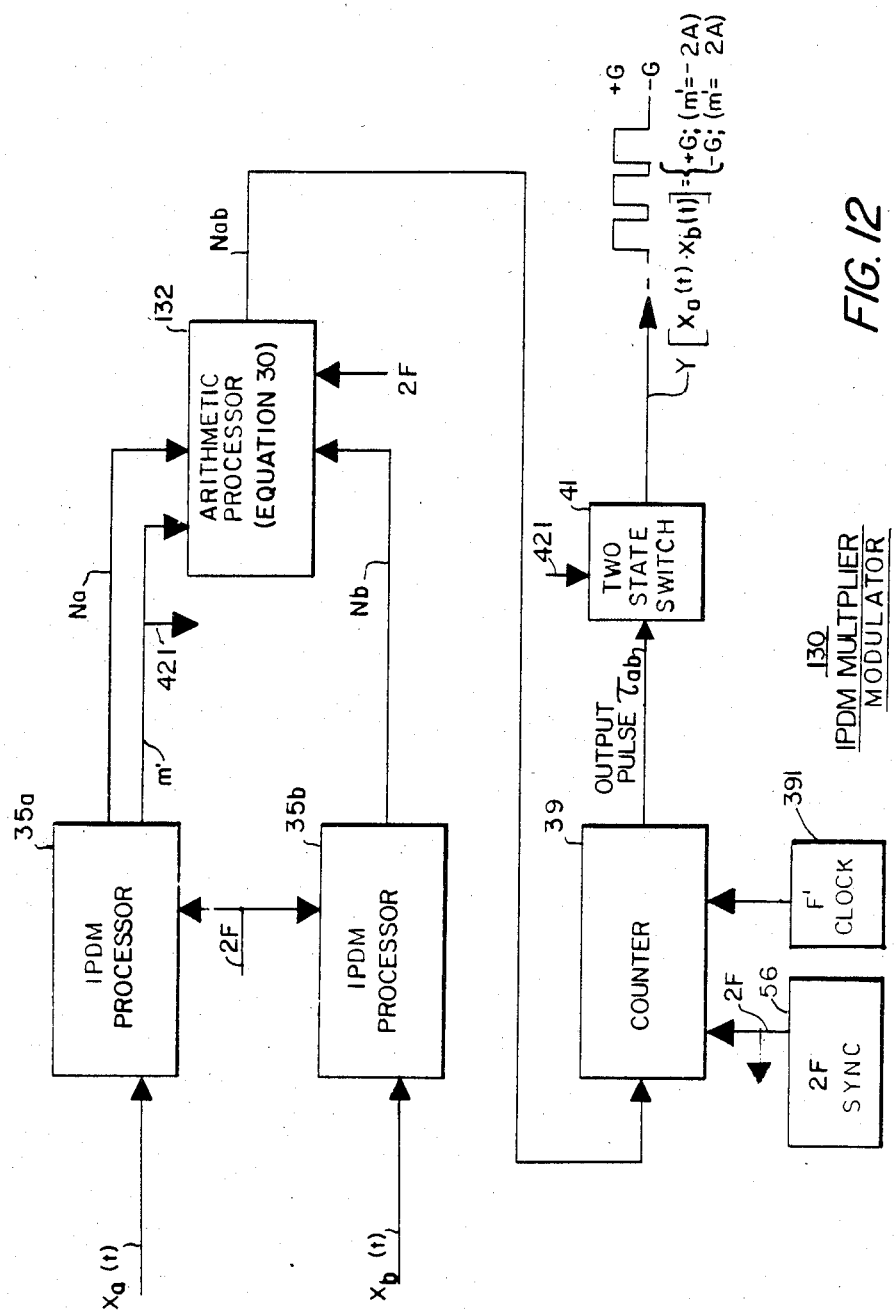
FIGS. 12 and 13 are block diagram circuits for multiplication of linear interpolated and approximation interpolated pulse duration signals, respectively.

FIG. 10 is an implementation of an IPDM adder modulator by either the one or two term MacLaurin IPDM processor 35' or 35" shown in FIGS. 4 and 5. The IPDM adder circuit 110 of FIG. 10 is shown with input signals $X_a(t)$, $X_b(t)$ applied to processors 35. In accordance with the earlier presentation of the feedback circuit of FIG. 7, the input signal 81 and the feedback signal 89 correspond to the signals $X_a(t)$, $X_b(t)$ of FIG. 10, respectively. The processors 35 typically may be processors 35' of FIG. 4 or processors 35" of FIG. 5 for a one or two term approximation of intercept time $\tau$, respectively. The eight-bit binary number from each processor 35 are provided as inputs to a binary summer 112. Another input, a seven-bit digital number plus a positive sign bit representing the value of T/4 ($\approx 128$ decimal) in clock counts, is provided from register 115 as a negative input of summer 112. The output of summer 112 is an eight-bit binary number ($<256$ decimal) which is provided as an input to counter 39 by a sync pulse at a 2F rate from source 56. Counter 39 is clocked at the frequency F' (17.92 MHz) to provide a pulse output at a time $\tau$ which corresponds to the summed $[X_a(t)+X_b(t)]$ intercept time with D(t) as shown in FIG. 8(a). The two state switch 41 changes state at each pulse output of counter 39 with the state $+G$ or $-G$ of Y(t) being determined by the sign of m' on line 421 provided to switch 41 from a processor 35.

Multiplication in the IPDM Domain

The linearity of interpolation pulse duration modulation over a specified dynamic range depends on the ratio $F/F_s$ of two quantities, the digitizing frequency F relative to the input signal frequency $F_s$, $F/F_s$. As this ratio increases, the linearity improves. Consequently, the lower the frequency of the input signal and the higher the digitizing frequency, the better the performance.

Increased bandwidth requirements bring about a lowering of the digitizing frequency to signal frequency ratio, $F/F_s$. A pseudo-modulation scheme has been devised to compensate for the deterioration in signal linearity for low ratios of $F/F_s$. The process involves the multiplication of two IPDM signals for which, individually, the relationship $F/F_s$ is satisfied. Low frequency information in the resulting IPDM waveform represents the product of the low frequency components within the respective input signals. An input signal thus is able to be modulated and frequency shifted to produce a higher frequency IPDM waveform. Signal linearity would have deteriorated if this technique was not used.

FIG. 11 shows the signals $X_a(t)$, $X_b(t)$ and D(t). The frequencies of both the low frequency input signals $F_{sa}$, $F_{sb}$, are significantly lower than that of D(t), the triangle dither signal. For simplicity consider $X_a(t)$, $X_b(t)$ to be of constant amplitude over the period of D(t) (a valid assumption since $F_{sa} < < F$ and $F_{sb} < < F$). The IPDM signal is constructed by considering the times $\tau'$, and $\tau''$ at which the signals $X_a(t)$, $X_b(t)$ intersect D(t). The time at which each of the two waveforms intersect D(t) is computed relative to the times at which the triangle signal D(t) changes slope (the apices of D(t)). As seen earlier (see IPDM addition), over a positive slope region of the triangle wave the time $\tau'$ (the intercept time) is $$\tau'=(T/4)(1+(X'/A)) \text{ (in the region that the slope of D(t) is positive)} \quad (17)$$

where X' is the amplitude of the input signal X(t) at the sample time which coincides with the time of the negative peak of D(t). If two input signals $X_a(t)$ and $X_b(t)$ are individually IPDM modulated $$\tau_a'=(T/4)(1+(X_a'/A)) \text{ (in the region that the slope of D(t) is positive)} \quad (18)$$

and, $$\tau_b'=(T/4)(1+(X_b'/A)) \text{ (in the region that the slope of D(t) is positive)}. \quad (19)$$

The switch point of a PDM waveform that is the result of the product of two waveforms $X_a(t)$ and $X_b(t)$, is $$\tau_{ab}'=(T/4)(1+(X_a'X_b'/A)) \text{ (in the region that the slope of D(t) is positive)}. \quad (20)$$

The time delays $\tau_a'$ and $\tau_b'$ are deterministic quantities. They are proportioned to clock counts $N_a$ and $N_b$ from identical IPDM processors 35a and 35b, respectively, of FIG. 12 over a period T/2. From this information, a count $N_{ab}$ proportional to a time intercept $\tau_{ab}'$ equivalent to that of the product of $X_a'(t)$ and $X_b'(t)$ is computed in computer 132. $N_{ab}$ counted by counter 39 at a rate F', relative to the 2F sync pulse is equivalent to $\tau_{ab}'$.

In order to derive the approximate time delay $\tau_{ab}'$, consider the following relationship between the quantities $$\tau_{ab}', \tau_a', \text{ and } \tau_b': \tau_{ab}'=\tau_a'+k\,\tau_b' \quad (21)$$

Substituting the three equations 18–20 into Eq. 21, assuming A=1, and solving for k $$k=X_a'(X_b'-1)/(X_b'+1) \text{ (in the region that the slope of D(t) is positive)} \quad (22)$$

Equation 21 is rewritten as $$\tau_{ab}'=\tau_a'+[X_a'(X_b'-1)/X_b'+1)]\,\tau_b' \text{ (A=1, in the region that the slope of D(t) is positive)}. \quad (23)$$

But, $$X_a'=(4/T)\,\tau_a'-1 \text{ and } X_b'=(4/T)\,\tau_b'-1 \text{ (A=1, in the region that the slope of D(t) is positive)}. \quad (24)$$

Thus, substituting $X_a'$ and $X_b'$ (equation 24), equation 23 becomes $$\tau_{ab}'=-\tau_a'-\tau_b'+(4/T)(\tau_a')(\tau_b')+(T/2) \text{ (A=1, in the region that the slope of D(t) is positive)}. \quad (25)$$

If equation 25 is negative or if it is greater than T/2, the multiplied signal "overmodulates" the processor. Therefore, to prevent "overmodulation" the following conditions must be satisfied: $X_A \leq A$, $X_B \leq A$ where $X_A$, $X_B$ and A are peak values of $X_a(t)$, $X_b(t)$, and D(t), respectively.

The dither signal D(t) has a negative slope over the second half period T/2. The intercept equation during this time period is $$\tau''=(T/4)(1-(X''/A)) \text{ (A=1, in the region that the slope of D(t) is negative)}. \quad (26)$$

Solving equation 5 for k with the proper negative slope substitutions, $$k = X_a'' \ (A=1, \text{ in the region that the slope of D(t) is negative}). \quad (27)$$

The product equation $\tau_{ab}''$ consequently is $$\tau_{ab}'' = \tau_a'' + \tau_b'' - (4/T)(\tau_a'')(\tau_b'') \text{ (in the region that the slope of D(t) is negative)}. \quad (28)$$

The generalized multiplication algorithm is $$\tau_{ab} = \pm \tau_a \pm \tau_b \mp (4/T)(\tau_a)(\tau_b) + T/4 \mp T/4 \text{ (upper signs in the region that the slope of D(t) is negative; lower signs in the region that the slope of D(t) is positive)}. \quad (29)$$

In general, both $\tau_a$ and $\tau_b$ are measurable characteristic properties of the individual PDM signals. The IPDM waveforms themselves are not needed to generate the two state waveform of their product. The digital IPDM processor circuitry 35 of FIG. 3 permits the recovery of the counts $N_a$ and $N_b$ before individual waveform generation since $N_a$ and $N_b$ are available as numerical outputs of respective intercept processors 35a, 35b of FIG. 12. Counts $N_a$ and $N_b$, that counted at a rate F', are equivalent to $\tau_a$ and $\tau_b$, respectively, during each interval T/2 of D(t). Equation 29 is rewritten in clock counts as the following:

$$N_{ab} = \pm N_a \pm N_b \mp (4/T_N)(N_a)(N_b) + T_N/4 \mp T_N/4 \quad (30)$$

Where $T_N$ equals the number of clock counts in the period of the triangular signal. Using $N_a$ and $N_b$, equation 30 for m'+ or −, respectively, is computed by arithmetic processor 132 shown in FIG. 13 to provide a numerical count $N_{ab}$ to the counter 39. Counter 39 operates at a rate F' and, relative to a 2F sync, generates an output pulse at the time $\tau_{ab}$. The output pulse triggers two state switch 41 which changes its output state Y(t) in response to the output pulse and the sign of m' on line 421; (Y(t) = −G when m' is + and vice versa).

Figure 13:
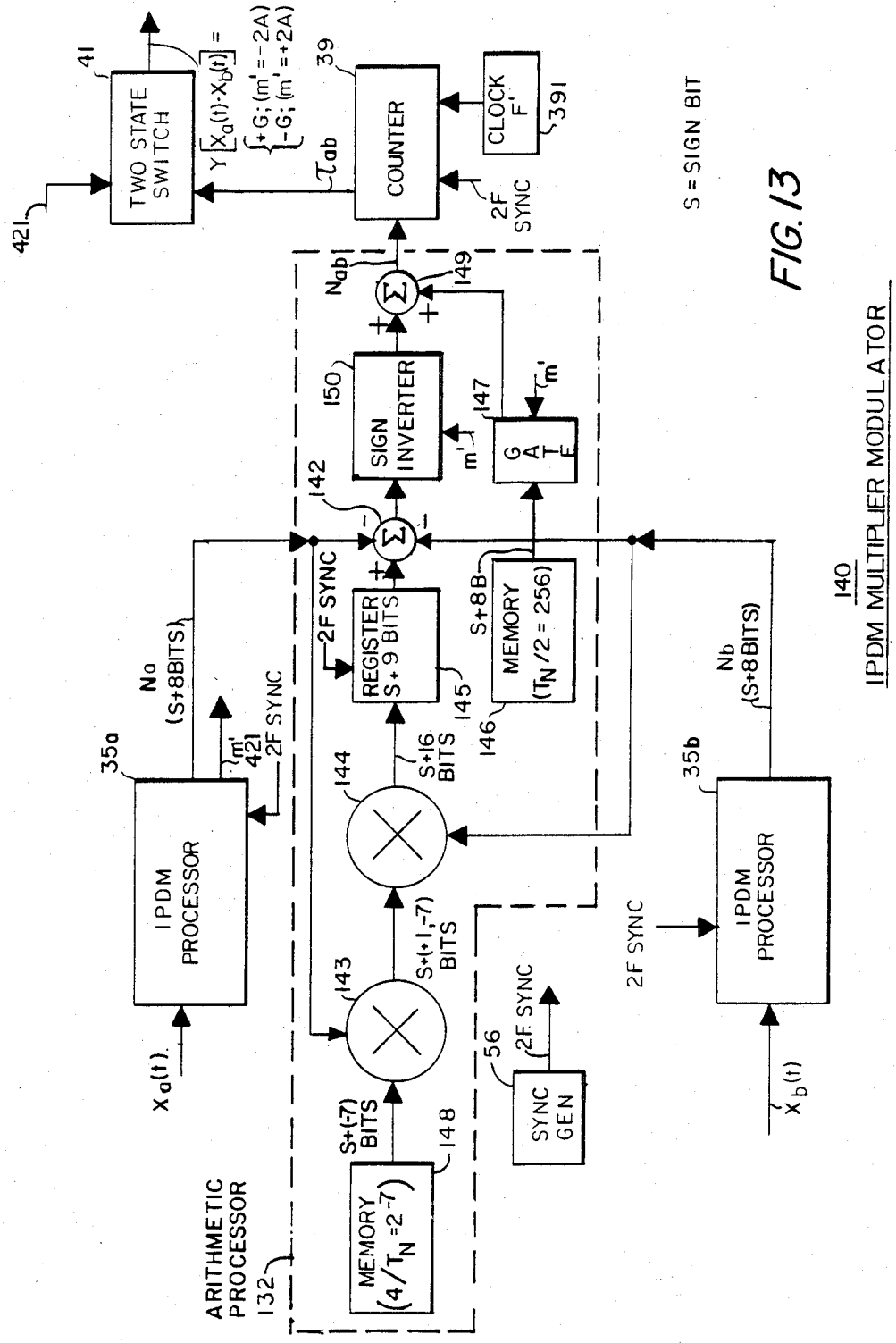

The implementation of IPDM multiplication by the IPDM multiplier modulator 140 of FIG. 13 may use processors 35 of the implementations of FIGS. 3, 4 and 5. Input signals $X_a(t)$ and $X_b(t)$ are applied to identical IPDM processors 35a, 35b, (these are equivalent to processor 35) which typically may be a one term approximation-type processor 35' of FIG. 4 or a two term approximation-type processor 35'' of FIG. 5. The eight-bit binary number from each processor 35 is provided to "subtract" inputs of summer 142 of processor 132. The $N_a$ output of one of the processors 35 is applied to a multiplier 143 whose other input is the quantity $4/T_N$ ($1/128 = 2^{-7}$ decimal) in the form of a binary number having a sign bit and seven bits to the right of the radix point. The output of multiplier 143 is a binary number of a sign bit and eight bits (one bit of which are to the left of the radix point) and is applied on one input to multiplier 144. The other input of multiplier 144 is the eight-bit binary number $N_b$ from processor 35. The output of multiplier 144 of the sign plus 16 bits is placed in register 145 which retains only the most significant eight bits and provides them to an "add" input of the summer 142. Summer 142 is followed by a sign inverter 150 which changes the sign of the summer 142 output as a function of m' (the slope of D(t)). If m' is negative, the output sign of summer 142 is not changed. If m' is positive, the output sign of summer 142 is inverted. The output of sign inverter 150 is applied as an input to summer 149. Summer 149 has another gated input signal from gate 147 connected to its input. For the positive slope of D(t), (+m'), equation 30 requires the addition of the quantity $T_N/2$ for the determination of the count of the intercept time of the product $X_a(t)X_b(t)$ with D(t). Therefore, $T_N/2$ ($\approx 256$ decimal) is stored in memory 146 as a sign plus eight-bit digital number. The binary number is gated into summer 149 by gate 147 when m' is positive (positive slope region of D(t)) but not when m' is negative (negative slope region of D(t)) since equation 30 does not contain the term $T_N/2$. The eight-bit output of summer 149, $N_{ab}$, is provided to counter 39 which is reset to a new count from summer 149 every $1/(2F)$ seconds (corresponding to the times of the peak values of D(t)). The count, $N_{ab}$, stored in counter 39 is counted by the clock pulses at an F' rate and provides a pulse output when the stored count is reached. The sequence of output pulses of counter 39 changes the output state Y(t) of two-state switch 41 to −G when m' is positive and to +G when m' is negative. The resulting waveform of Y(t), Y[$X_a(t)X_b(t)$], is the IPDM modulation signal corresponding to the product of $X_a(t)$ and $X_b(t)$.

Figure 7:
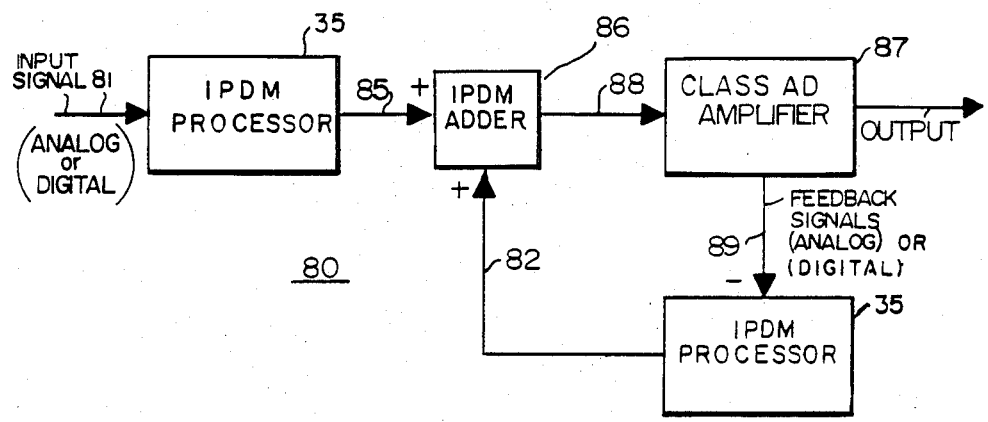
FIG. 7 is a block diagram of a negative feedback amplifier using interpolated pulse width modulation signals.

Although this invention has been described in terms of operating on analog input signals X(t) to produce a pulse duration modulated output waveform, it is apparent to those skilled in the art that the input signals may have their amplitudes in sequential digital representation as a function of time. Thus, sample circuit 31 of FIG. 4 which provides a digital sampled signal output from an input analog signal and hence implicitly contains an analog-to-digital converter could provide a digital output from a digital input signal without any need for A/D conversion. FIG. 7 explicitly designates the input signal as either analog or digital, as one example. Also, operations of the circuitry may be performed in the analog or digital domain according to the desires of the person skilled in the art.

All IPDM modulators described herein have a gain G and hence may also be characterized as IPDM amplifiers. For this reason the terms "modulator" and "amplifier" are used interchangeably throughout the description of the invention.

Having described a preferred embodiment of the invention, it will now be apparent to one of skill in the art that other embodiments incorporating its concept may be used. It is felt, therefore, that this invention should not be restricted to the disclosed embodiment, but rather should be limited only by the spirit and scope of the appended claims.

What is claimed is:

1. A method for providing a pulse duration modulated signal comprising:
   determining the successive amplitude values of a first signal at predetermined times of constant interval;
   computing the slope of said first signal at each of said predetermined times;
   generating a second signal which varies linearly between each two said successive amplitude values of said first signal;
   generating a third signal which is linear between said predetermined times of constant interval and having its positive and negative peak amplitudes at said predetermined times;

determining the times relative to said predetermined times at which said second and third signals have equal amplitudes; and changing the state of a two-state output signal at each of said equal amplitude times to thereby produce a pulse duration signal representation of said first signal.

2. The method of claim 1 wherein:

said step of computing the slope of said first signal comprises taking the difference of two successive amplitudes of said first signal and dividing the result by said constant inverval.

3. The method of claim 2 comprising in addition:

determining the sign of the slope of said third signal at each occurrence of equal amplitudes of said second and third signals; and controlling the polarity of the state of the output signal in accordance with said slope sign.

4. A method for providing a pulse duration modulated signal comprising:

providing a triangular waveform of frequency $F_s$;

sampling an input signal to provide successive amplitudes of said input signal at a frequency $2F_s$, said sampling occurring at times corresponding to the peaks of said triangular waveform;

generating a signal which is linear between said successive sampled amplitudes of said input signal;

determining the successive times at which the triangular waveform has the same value as said generated signal; and changing the state of a two-state output signal at said successive times.

5. The method of claim 4 wherein said step of generating a signal which varies linearly between successive samples of the amplitude of said input signal comprises:

obtaining the difference of two successive said samples;

determining the slope of said sampled input signal from said difference of two successive sample values and the time between samples; and determining the instantaneous amplitude of said generated signal from the amplitude of the first of said successive samples and the slope value.

6. The method of claim 5 comprising in addition:

determining the sign of the slope of said triangular waveform at the time that the triangular waveform has the same value as said generated signal; and controlling the state of the changed output signal at said time in accordance with the sign of the slope.

7. A method for providing a pulse duration modulated signal comprising:

sampling an input signal at a constant sampling frequency to provide a succession of sampled input signal amplitude values;

calculating a succession of slopes of said input signal from the difference of a succession of two successive amplitude values of said sampled input signal;

calculating a succession of slope of a triangular waveform from the difference of its successive apexes;

said sampling occurring at the time of occurrence of said apexes of said triangular waveform;

calculating the intercept time measured from the first of each two of said successive apexes by taking the difference of said first apex value and the first of each of said two sampled amplitude values of said input signal and dividing by the difference of said slopes; and changing the output state of a two-state output signal at times corresponding to the succession of calculated intercept times to produce a pulse duration modulation representation of said input signal.

8. The method of claim 7 comprising in addition:

determining the sign of the slope of the triangular waveform at each intercept time; and controlling the polarity of said output state in accordance with said sign at the intercept time.

9. A circuit for providing a pulse duration modulated signal comprising:

an input signal;

means for providing synchronizing pulses at a first frequency;

means for sampling said input signal in response to said synchronizing pulses to provide a succession of sampled signals "b";

first means for storing each sampled signal until the next of said succession of sampled signals is provided by said sampling means in response to said synchronizing pulses;

second means for storing the positive and negative peak values "b'" and slope values "m'" of a triangular waveform;

means for switching the output of said storing means in response to said synchronizing pulses to provide a sequence of a pair of said positive peak value and said negative slope value alternating with a pair of said negative peak value and said positive slope value;

an arithmetic processor responsive to said sequence of said pairs of values from said switching means and to pairs of one of said succession of sampled signals and one of said succession of stored sampled signals to compute the slope "m" of said sampled signal and to compute a time t value according to the equation $t=(b'-b)/(m-m')$ for each one of said succession of sampled signals;

a counter set by said synchronizing pulse to a number corresponding to the value of time t provided by said processor;

a source of clock pulses of higher frequency than said synchronizing frequency providing clock pulses to said counter;

said counter providing an output pulse when the value of number provided by the processor is reached; and a two-state switch responsive to the output pulse of said counter to provide a change in the output state of said switch at each occurrence of said output pulse.

10. The circuit of claim 9 comprising in addition:

means for determining the sign of the slope m' of said triangular waveform and providing said sign to said two-state switch to control the polarity of the output state of said switch in accordance with the polarity of said sign.

11. A circuit for providing a pulse duration modulated signal comprising:

a source of an input signal;

means for providing a succession of synchronizing pulses;

means for sampling said input signal in response to said synchronizing pulses to provide a succession of sampled values of said signal;

a summing circuit;

means for alternately switching said sampled signal values to the positive and negative inputs of said summing circuit in response to said synchronizing pulses;

a memory for providing a number having a value at least as great as the values of said sampled signal applied to a positive input of said summing circuit;

a register storing the output of said summing circuit in response to each said synchronizing pulse;

a counter receiving the number stored in said register in response to each said synchronizing pulse;

a source of clock pulses of a higher frequency, said synchronizing pulses providing clock pulses to said counter;

said counter providing an output pulse when the number received by the counter is counted by said clock pulses; and a two-state switch responsive to the output pulse of said counter to provide a change in the output state of said switch at each occurrence of said output pulse.

12. The circuit of claim 11 comprising in addition:

said switch providing a sign signal indicative of the position of said switch to said two-state switch; and said sign signal controlling the polarity of the output state of said switch in accordance with the polarity of said sign.

13. A circuit for providing a pulse duration modulated signal comprising:

an input signal;

means for providing a succession of synchronizing pulses;

means for sampling said input signal in response to said pulses to provide a succession of sample values of said signal;

means for delaying said sampled signals by the period of said pulses to provide delayed sampled signals;

a first register containing a first number responsive to said pulses to provide an output of said first number with a positive or negative polarity which alternates with each of said pulses;

first means summing the outputs of said sample means, said delay means, and said first register to provide a first summed output signal;

a second register containing a second number half the value of said first number to provide said second number as one output signal with alternating polarity in response to said pulses, said first and second number output signals being of the same polarity during each alternation;

a second means summing the outputs of said delay means and said second register;

means multiplying the outputs of said first and second summing means;

a third register storing the successive outputs of said multiplying means in response to said synchronizing pulses;

a counter receiving the number stored in said third register in response to each synchronizing pulse;

a source of clock pulses of a higher frequency than said synchronizing pulses providing clock pulses to said counter;

said counter providing an output pulse each time that the count transferred by said third register is counted by said clock pulse; and a two-state switch responsive to the output pulses of said counter to provide a change in the output state of said switch at each occurrence of said output pulses.

14. The circuit of claim 13 comprising in addition:

said first register providing a sign signal in accordance with the polarity of its output first number to said two-state switch; and said sign signal controlling the polarity of the output state of said switch in accordance with the polarity of said sign.

15. A method for providing a pulse duration modulated signal comprising:

sampling an input signal at a constant sampling frequency to provide a succession of sampled input signal amplitude values;

calculating a succession of slopes of said input signal from the difference of a succession of two successive amplitude values of said sampled input signal;

alternating the sign of a numerical quantity to provide a signed numerical value at the time of said sampling of said input signal, said signed numerical value corresponding to the slope of a triangular waveform at said sample time;

calculating the intercept times measured from said sample times by taking the difference of said signed numerical value and the corresponding said sampled input signal amplitude value and dividing by the difference of said slopes; and changing the output state of a two-state output signal at times corresponding to the succession of calculated intercept times to produce a pulse duration modulation representation of said input signal.

* * * * *